United States Patent
Kwoka et al.

(10) Patent No.: US 7,174,626 B2
(45) Date of Patent: Feb. 13, 2007

(54) METHOD OF MANUFACTURING A PLATED ELECTRONIC TERMINATION

(75) Inventors: Mark A. Kwoka, Palm Bay, FL (US); Jack H. Linn, Melbourne, FL (US)

(73) Assignee: Intersil Americas, Inc., Milpitas, CA (US)

( * ) Notice: Subject to any disclaimer, the term of this patent is extended or adjusted under 35 U.S.C. 154(b) by 638 days.

(21) Appl. No.: 09/343,845

(22) Filed: Jun. 30, 1999

(65) Prior Publication Data
US 2002/0029473 A1    Mar. 14, 2002

(51) Int. Cl.
*H01R 43/00* (2006.01)
*H01R 43/16* (2006.01)

(52) U.S. Cl. ............... 29/827; 29/874; 29/882; 29/885; 72/47

(58) Field of Classification Search .......... 29/885, 29/827, 882, 884, 841, 861, 838, 874; 257/676, 257/666, 673, 677; 72/366, 2
See application file for complete search history.

(56) References Cited

U.S. PATENT DOCUMENTS

| | | | |
|---|---|---|---|
| 4,045,869 A * | 9/1977 | Hartmann et al. ............ 29/630 |
| 4,055,062 A | 10/1977 | Martin et al. | |
| 4,089,733 A * | 5/1978 | Zimmerman ................... 25/6 |
| 4,214,120 A * | 7/1980 | Jones, Jr. et al. ............ 174/52 |
| 4,717,948 A * | 1/1988 | Sakai et al. .................. 357/74 |
| 4,797,726 A * | 1/1989 | Manabe ........................ 357/70 |
| 5,059,455 A * | 10/1991 | Hasselbach et al. ........ 427/292 |
| 5,151,846 A * | 9/1992 | Sedigh et al. ............... 361/306 |
| 5,218,229 A * | 6/1993 | Farnworth .................. 257/676 |
| 5,235,743 A * | 8/1993 | Endo et al. ................... 29/685 |
| 5,256,598 A * | 10/1993 | Farnworth et al. ......... 437/220 |
| 5,258,331 A * | 11/1993 | Masumoto et al. ......... 437/212 |
| 5,259,111 A * | 11/1993 | Watanabe .................... 29/885 |
| 5,274,911 A * | 1/1994 | Toro ............................. 29/827 |
| 5,307,562 A * | 5/1994 | Denlinger et al. ............ 29/882 |
| 5,360,991 A | 11/1994 | Abys et al. | |
| 5,522,133 A | 6/1996 | Kawauchi | |
| 5,548,160 A * | 8/1996 | Corbett et al. .............. 257/666 |
| 5,548,890 A * | 8/1996 | Tada et al. .................... 29/827 |
| 5,959,347 A * | 9/1999 | Grigg et al. ................ 257/668 |
| 5,964,904 A * | 10/1999 | Jin et al. .................... 29/623.5 |
| 6,194,777 B1* | 2/2001 | Abbott et al. .............. 257/666 |
| 6,336,973 B1* | 1/2002 | Moden et al. .............. 118/406 |

FOREIGN PATENT DOCUMENTS

| | | | |
|---|---|---|---|
| EP | 1065711 | * | 3/2001 |
| JP | 60 225455 | | 11/1985 |
| JP | 61 048951 | | 3/1986 |
| JP | 61 234554 | | 10/1986 |
| JP | 63 072895 | | 4/1988 |
| JP | 63 306648 | | 12/1988 |
| JP | 03230556 A | * | 10/1991 |
| JP | 03274756 A | * | 12/1991 |

(Continued)

*Primary Examiner*—Minh Trinh
(74) *Attorney, Agent, or Firm*—Fogg and Associates LLC; Scott V. Lundberg

(57) ABSTRACT

A method of making a lead finish incorporating mechanically flattening the plated coating of metal leads. This may be accomplished by mechanical means such as rolling, stamping, peening, coining, forging, or other suitable flattening techniques.

27 Claims, 5 Drawing Sheets

FOREIGN PATENT DOCUMENTS

| | | | | |
|---|---|---|---|---|
| JP | 04268055 A | * | 9/1992 | |
| JP | 05 315511 | | 11/1993 | |
| JP | 06 302938 | | 10/1994 | |
| JP | 08139251 A | * | 5/1996 | |
| JP | 09092763 A | * | 4/1997 | |

* cited by examiner

SERIAL NUMBER, PHOTO ID / MAGNIFICATION / ACCUMULED DISTANCE
POTENTIAL APPLIED TO ELECTRON BEAM TO DO ELECTRON MICROSCOPY

METHOD OF MANUFACTURING A PLATED ELECTRONIC TERMINATION

BACKGROUND OF INVENTION

At the point where an integrated circuit (IC) device with leads/terminations is joined to a circuit board, suitable means must be provided for making satisfactory electrical and mechanical connections between the leads/terminations and the circuit board. A lead is the metal wiring protruding from the integrated circuit package which is used to create an electrical connection with the circuit board upon which the integrated circuit will be mounted. A termination is a surface that is used to create an electrical connection between any electrical or electronic elements. A connection is deemed satisfactory when it meets industry defined requirements of visual properties of wetting and filleting and furnishes a path that does not alter the intended electrical characteristics of signals that are transmitted through it. Wetting is the ability of a liquid to spread over or cover over a solid surface with which it makes contact. Filleting is a description of the volume, height, area and circumference of a joining material used to connect two surfaces. The connection must also be mechanically permanent.

These permanent connections are usually made by soldering. In soldering, two metal surfaces are united when a solder junction is formed between them. Solder is a metal or metal composition which melts at a fairly low temperature (approximately 200 C) and wets the surfaces to which it is applied in the molten state. Solder is an alloy, such as zinc and copper, or tin and lead. Upon cooling, solder forms a permanent mechanical and electrical connection between the surface of the semiconductor lead/termination and the surface of the circuit board.

Improving the mechanical connection so as to maximize the amount of solder wetting and filleting between soldered surfaces has always been desired in the art of soldering. Others have attempted to improve the soldered connection of tin/solder plating by using special bathing processes or special plating process/fixturing techniques. Our invention is directed toward a method of manufacturing leads/terminations so as to improve their solderability. Solderability is the ability of a material or surface to be wetted with molten solder under specified conditions.

SUMMARY OF INVENTION

The manufacturing processing of making a packaged IC includes the application of a lead/termination finish to the metal leads/terminations to preserve and enhance the inherent solderability of the underlying basis metal leads/terminations. This lead/termination finish is typically applied as a thin coating. The lead/termination finish preserves the metal leads/terminations and allows the packaged IC or electrical/electronic component to be readily soldered into the circuit board. There are two common ways of applying the lead/termination finish: (1) a tin/lead soldering plating lead finish process, or (2) a molten hot solder dip process. These two aforementioned processes are well-known in the art of soldering and IC manufacturing.

Both methods of applying the lead/termination finish have their advantages and disadvantages. Molten hot dip processes provide a high quality finish, but controlling the coating thickness distribution is difficult. The maximum coating thickness attained is limited due to liquid surface tension considerations. Plating processes are much more easily controlled with respect to coating thickness distribution. The maximum coating thickness achievable is unbounded. However, the solderability, or the ability of a surface to be wetted by molten solder, of plating is typically not as good as molten hot dip lead/terminations finishes.

We have developed an improved method of manufacturing IC packaging so that the leads have a higher degree of solderability. This improvement has been measured and tested using steam aging and wetting balance measurements. The method of making a lead finish incorporates mechanically flattening the plated coating of the leads. This may be accomplished by mechanical means such as rolling, stamping, peening (surface-hardening a piece of metal by hammering or bombarding with a hard shot), coining (forming metals by squeezing between two dies so as to impress well-defined imprints on both surfaces of the work), forging (using compressive force to shape metal by plastic deformation) or other suitable flattening techniques. Of these techniques, we found rolling produces superior results. By flattening the coating of the leads, the surface becomes less porous and the overall surface area is minimized requiring less work to be required to wet the lead/termination surface. Also, flattening the coating minimizes the deleterious effects of amorphous ridges and grooves which results in superior solderabiity. Amorphous ridges and grooves can be associated with the grain structure of commonly applied lead/termination finishes.

Our invention is not only directed to IC packaging, but to all plated electronic terminations. This includes, but is not limited to, semiconductor components, discrete passive components, connectors, lugs, terminals, wires and any coated surface that may be involved in a joining operation utilizing a liquid phase material to provide the joining medium between two or more surfaces. Our invention can be used on existing plating lines with no changes required to the electroplating process chemistry or electroplating process. This process could be applied to other types of plating such as silver plating, gold plating, nickel palladium plating and tin plating.

SUMMARY OF THE INVENTION

I have discovered that flattening the lead of an electronic device, most notably the lead of an integrated circuit, increases the solderability of the lead. Flattening may be accomplished by rolling, stamping, peening, coining, forging or other suitable flattening techniques.

DETAILED DESCRIPTION OF THE PREFERRED EMBODIMENT

Figure 1:
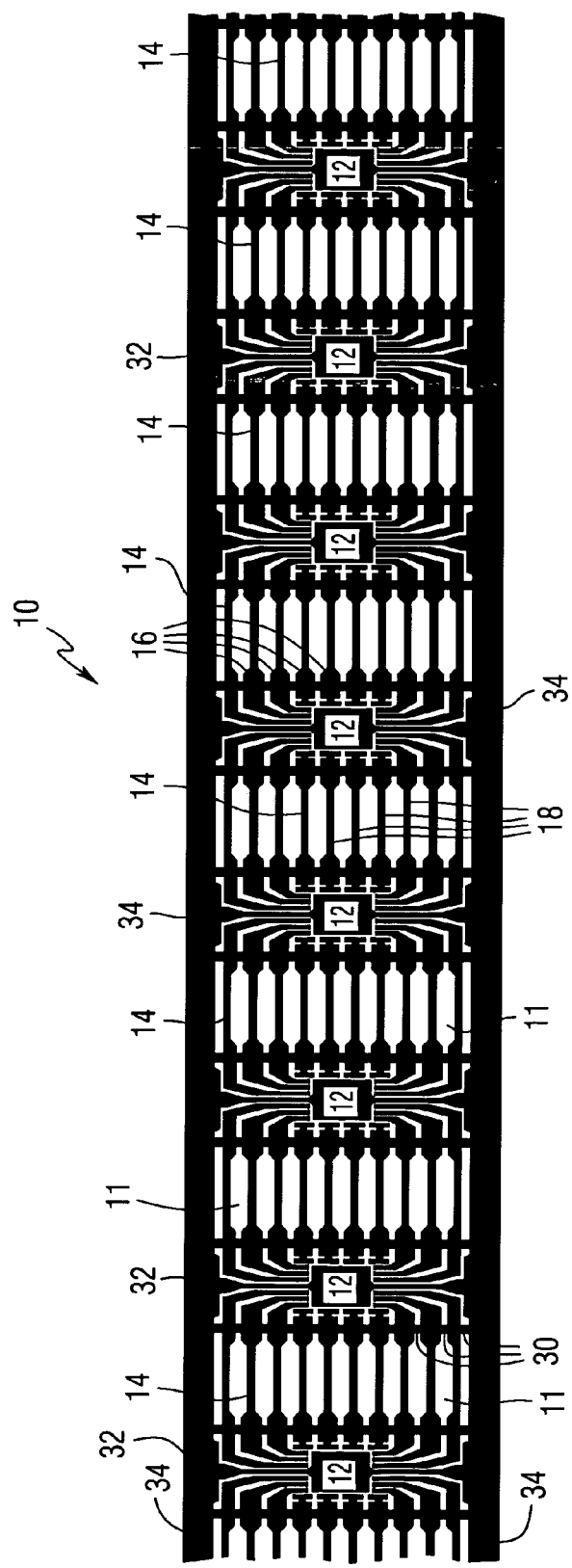
FIG. 1 is a diagram of a lead frame.

Packaged integrated circuits are manufactured using metal lead frames that have substantially flat surfaces. The integrated circuit in chip (die) form is attached to the lead frame (which may have a special silver or copper spot plated on it for die attachment), wire bonded and either transfer molded, furnace sealed or welded to produce an encapsulated (Packaged) integrated circuit with leads protruding from the package body. FIG. 1 shows the outline of a ribbon 10 containing a metal lead frame 11 which includes a central die pad 12 and a plurality of leads 14. The IC chips (not shown) are mounted on die pads 12.

The integrated circuits chips are spaced interstitially and mounted upon IC die pads 12 which conform substantially to the shape of the be chip attached (e.g., rectangular as shown). Flat metal leads 14 make an electrical contact with the bond pads of the integrated circuit with thin bond wires (not shown) extending from the lead to a bond pad on the IC. As seen in FIG. 1, at the inner end 16 of the metal leads 14 surround the circumference of the IC die pad 12. The metal leads 14 all extend radially outward from the IC die pad 12. At the outer end 18 of the metal leads 14, the metal leads 14 project at an angle parallel with the ribbon 10 towards the metal leads 14 of the next IC packaging frame.

Adjacent leads are held together and are held on the frame by dam bars 30. The die pad 12 is connected to rails 34 by the tie bars 32. After the dies (not shown) are attached to the die pad 12, the lead frame is placed in the mold. Molten plastic is transfer molded into the mold to enclose the die and the leads inside the perimeter formed by the rails 34 and damn bars 30. After the molded devices cool, the dam bars 30 and the tie bars 32 are severed from the rails 34 in a conventional lead trim operation. The leads 14 may then be bent to a desired angle in a conventional forming operation. This results in frames for individual IC packages. Preferably before the chip is attached, but at least before the insertion into the circuit board, the coating of the metal leads 14 are flattened. This may be accomplished by mechanical means such as rolling, stamping, peening, coining, forging or other suitable flattening techniques. The bent metal leads 14 are inserted in and soldered to the circuit board.

Both prior to and after flattening, the coating on the leads have a thickness of about 10 microinches to about 1000 micoinches, with the solderability surface contact area representing about 10–100% of the total surface area of the coating. The lead thickness of reduced form 0.1% to about 10% of its original size prior to flattening. In one embodiment, the lead is flattened until there is a reduction of about 0.1% to about 10% in coating thickness. Further in another embodiment, the lead is flattened until there is a reduction of about 80% to 90% in the porosity.

Figure 2A:
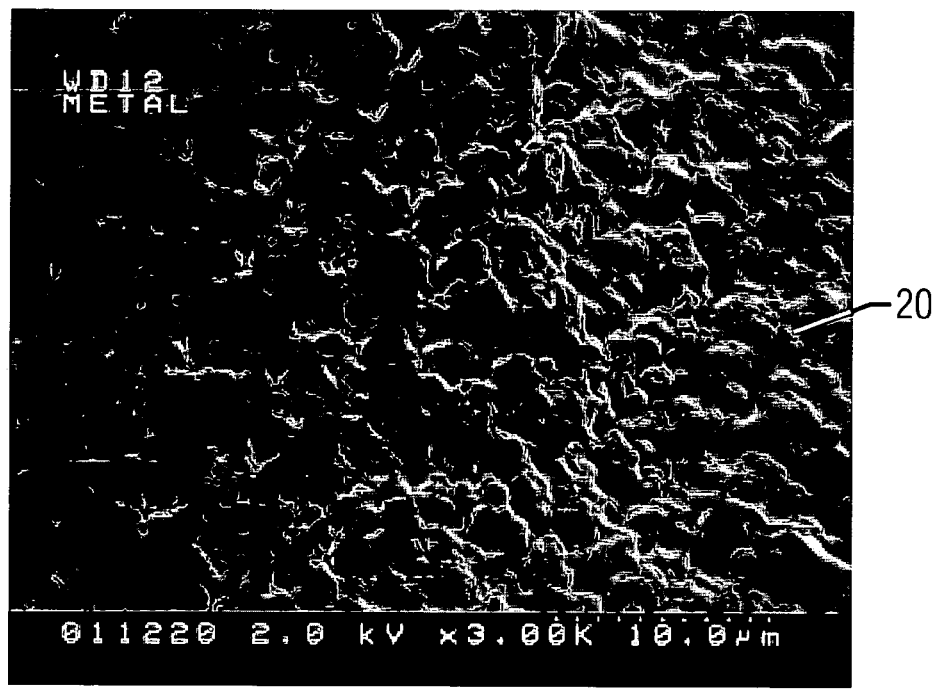
FIG. 2(a) is a photo micrograph of the coated surface of a lead that was flattened on the left hand side but not the right and magnified 3,000 times.
Figure 2B:
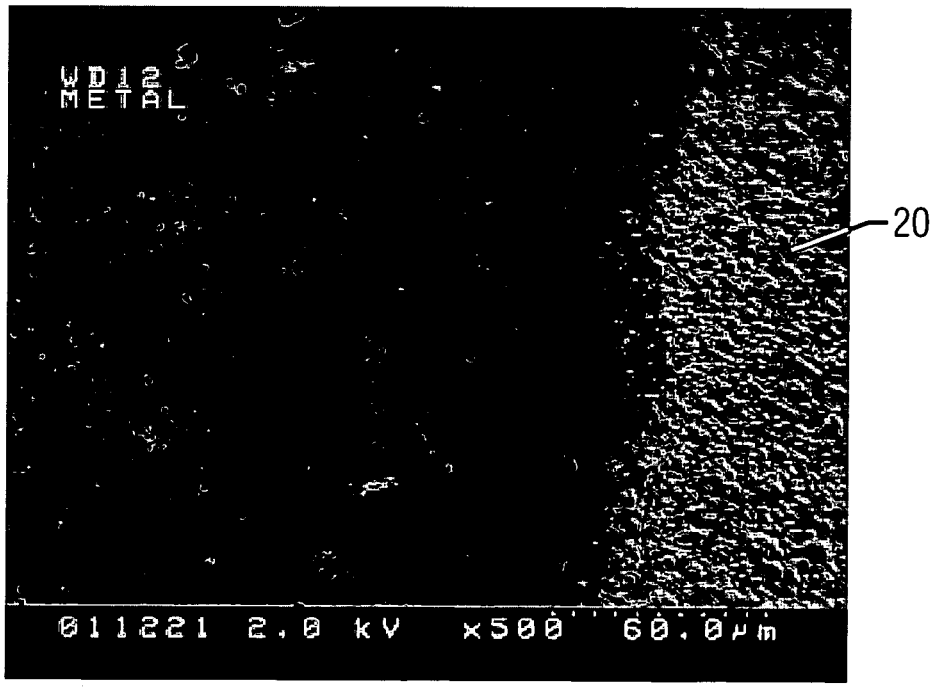
FIG. 2(b) is a photo micrograph of the coated surface of a lead that was flattened on the left hand side but not the right and magnified 500 times.
Figure 3A:
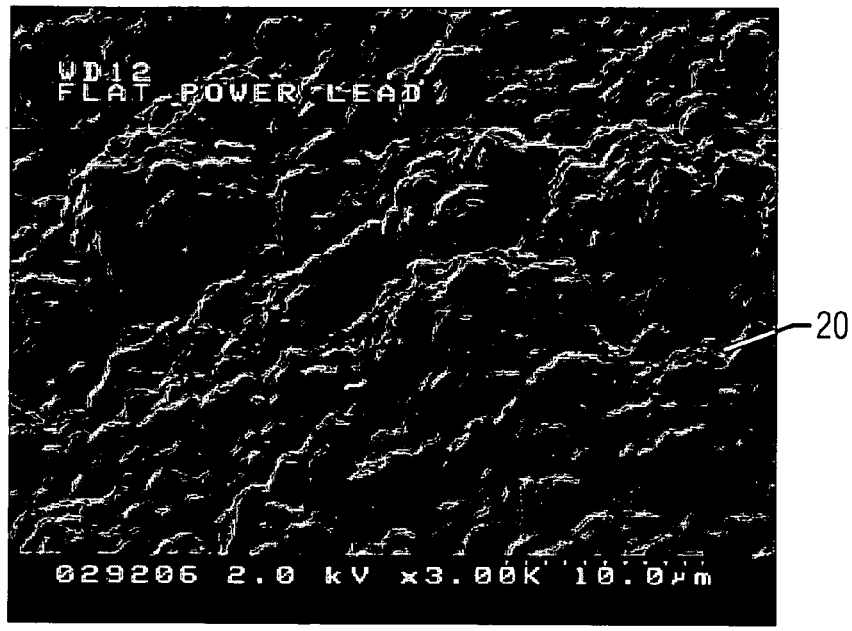
FIG. 3(a) is a photo micrograph of the coated surface of a lead that was not flattened and magnified 3,000 times.
Figure 3B:
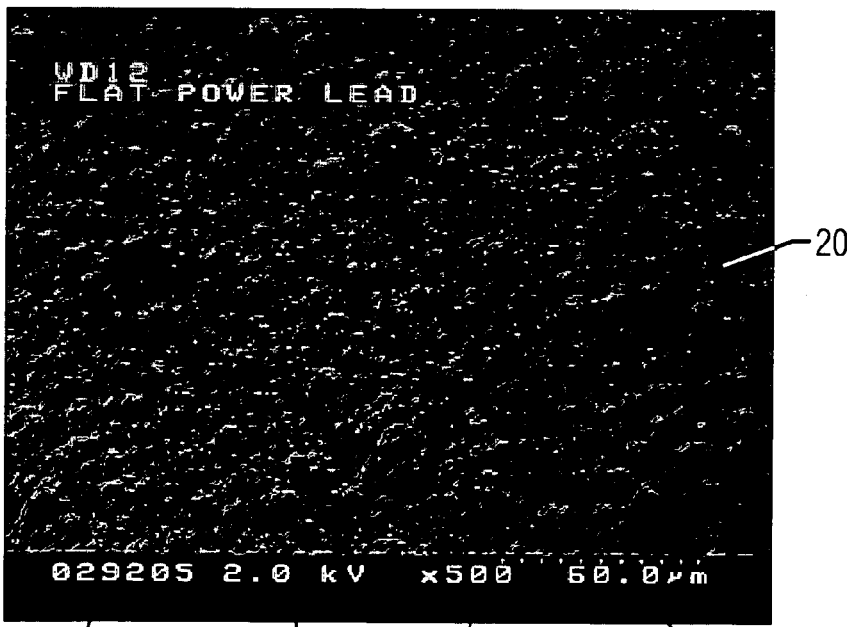
FIG. 3(b) is a photo micrograph of the coated surface of a lead that was not flattened and magnified 500 times.
Figure 4A:
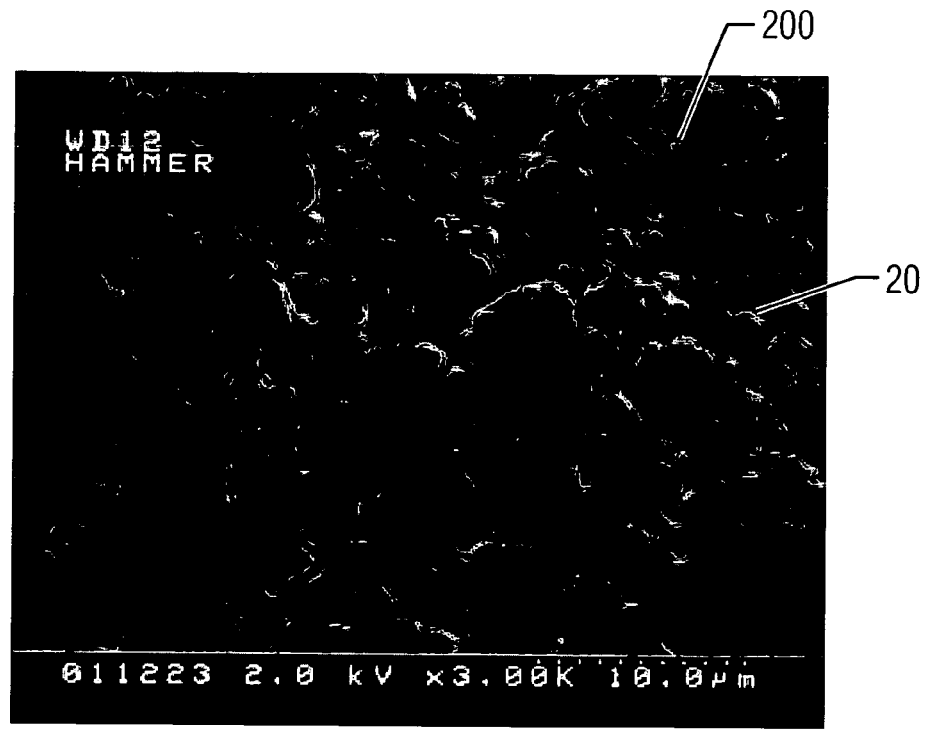
FIG. 4(a) is a photo micrograph of the coated surface of a lead that was partially flattened by hammering and magnified 3,000 times.
Figure 4B:
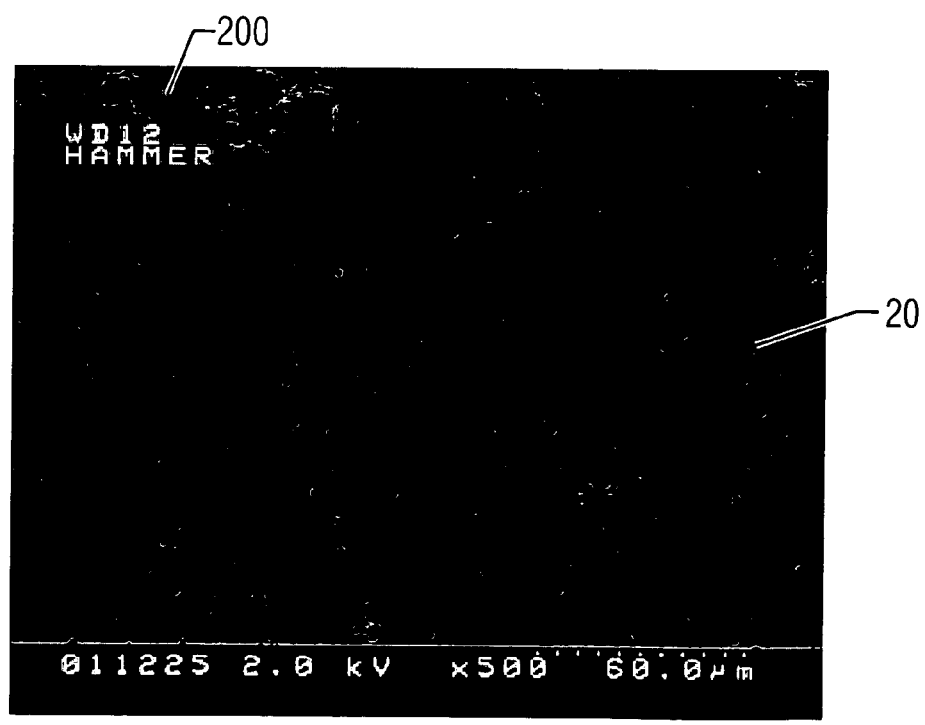
FIG. 4(b) is a photo micrograph of the coated surface of a lead that was partially flattened by hammering and magnified 500 times.

FIGS. 2–4 are photo micrographs of the coated surface of the leads. At the bottom far left is the serial number of the picture, which the reader may ignore. The second number, 2 KV, represents the voltage applied to the electronic microscope. FIGS. 2(a), 3(a), and 4(a) show the coated lead surface 20 magnified 3,000 times. FIGS. 2(b), 3(b), and 4(b), and 5(b) show the coated lead surface 20 magnified 500 times. FIGS. 2(a) and 2(b) shows a lead coating that was flattened on the left hand side but not flattened on the right. The difference in smoothness in FIGS. 2(a) and 2(b) between the flattened area on the left and un-flattened area on the right is readily apparent. Moving from left to right in FIGS. 2(a) and 2(b) one can see a substantially smooth surface that is relatively low in porosity on the left, transforming more and more into a surface that is not smooth and is of high porosity as one moves to the right.

FIGS. 2(a) and 2(a) should be contrasted with FIGS. 3(a) and FIG. 3(b), the later two being un-flattened. Note however how substantially smoother the partially flattened surface of 2(a) as compared to the un-flattened surface of 3(a). The same is also true comparing the partially flattened section of FIG. 2(b) with un-flattened surface shown in FIG. 3(b). FIGS. 4(a) and 4(b) show the result of hammering. Comparing FIGS. 4(a) and 4(b) to 3(a) and 3(b) reveals that hammering smooths the surface and reduces porosity. Note the rougher sections 200 that were missed by the hammer.

Prior to flattening, the lead coating in this specific embodiment comprises consist of 80/20 Tin/Lead. These leads are used for devices packaged in the Harris TO-220 package.

Figure 5A:
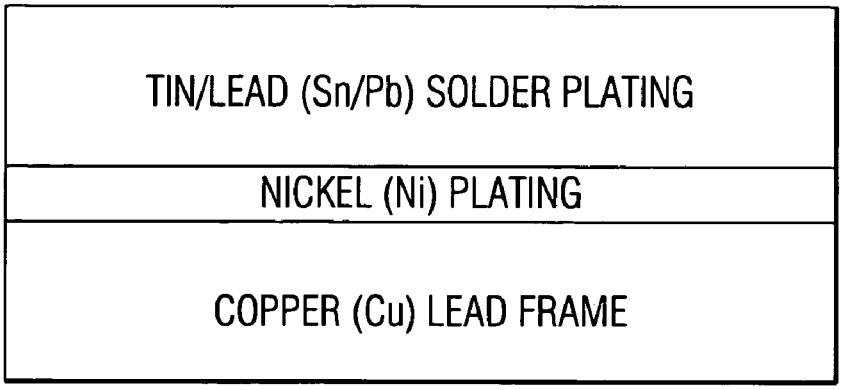
FIG. 5(a) is a schematic representation of a lead frame with a bottom layer of copper, a middle layer of nickel plating, and a top layer of solder plating.
Figure 5B:
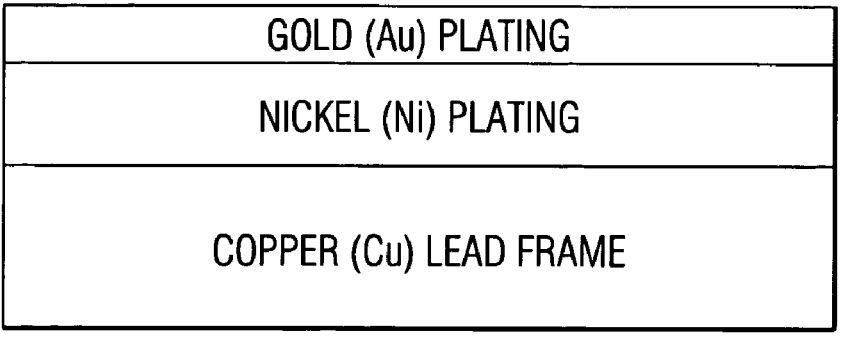
FIG. 5(b) is a schematic representation of a lead frame with a bottom layer of copper, a middle layer of nickel plating, and a top layer of gold plating.
Figure 5C:
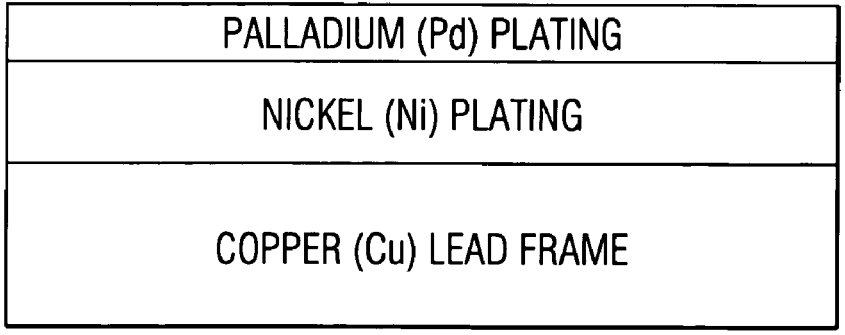
FIG. 5(c) is a schematic representation of a lead frame with a bottom layer of copper, a middle layer of nickel plating, and a top layer of palladium plating.

FIGS. 5(a), 5(b) and 5(c) shows varying lead frames and their coatings. FIGS. 5(a), 5(b) and 5(c) all show a lead frame bottom layer of copper and a middle layer of nickel plating. The top layer of plating (which provides the solderability surface contact area) differs for each-in 5(a) the top layer plating is of tin/lead solder plating, in 5(b) the top layer is of gold plating, in 5(c) the top layer is of palladium plating. Using a coating of gold on nickel whereby the coating of gold is 2 micro-inches or less is a preferred embodiment. Using any of these aforementioned combinations is contemplated.

While the aforementioned materials and methods are preferred, the use of other soldering lead materials is contemplated within the scope of the invention as claimed.

We claim:

1. A method of manufacturing metal leads of electrical devices comprising the steps of:
   applying a coating to the metal leads;
   after coating the metal leads, flattening the metal leads by compression until there is a reduction of about 80% to 90% in porosity of the coating thickness after flattening as compared to before the flattening of the leads.

2. A method of manufacturing metal leads of an integrated circuit package comprising the steps of:
   applying a coating to the metal leads of the integrated circuit package;
   after coating the metal leads, flattening each of the metal leads by compression until each of the metal leads is substantially smoother and substantially less porous; and
   applying the coating to the metal leads so that the coating has a thickness of about 10 microinches to about 1000 microinches prior to flattening and there is a reduction of about 0.1% to about 10% in coating thickness after flattening.

3. A method of manufacturing metal leads of electrical devices comprising the steps of:
   applying a coating to the metal leads; and
   after coating the metal leads, flattening the metal leads by compression until there is a reduction of about 0.1% to about 10% in coating thickness so that each metal lead is substantially smoother and substantially less porous after flattening as compared to before the flattening of the leads.

4. The method of manufacturing a lead or termination of claim 3 further comprising:
flattening the metal leads/terminations by rolling.

5. The method of manufacturing metal leads of claim 3 further comprising:
flattening the metal leads by stamping.

6. The method of manufacturing a lead or termination of claim 3 further comprising:
flattening the metal leads/terminations by peening.

7. The method of manufacturing a lead or termination of claim 3 further comprising:
flattening the metal leads/terminations by coining.

8. The method of manufacturing a lead or termination of claim 3 further comprising:
flattening the metal leads/terminations by forging.

9. The method of manufacturing a lead or termination of claim 3 further comprising:
flattening the metal leads/terminations by hammering.

10. The method of manufacturing a lead or termination of claim 3 wherein the step of applying a coating to the metal leads/terminations of the electrical device is comprised of coating the lead or termination with a Tin/Lead composition.

11. The method of manufacturing a lead or termination of claim 3 wherein the step of applying a coating to the metal leads/terminations of the electrical device is comprised of coating the lead or termination with a 80/20 Tin/Lead composition.

12. The method of manufacturing a lead or termination of claim 3 wherein the step of applying a coating to the metal leads/terminations of the electrical device is comprised of subjecting the lead or termination to a tin/lead soldering plating lead finish process.

13. The method of manufacturing a lead or termination of claim 3 wherein the step of applying a coating to the metal leads/terminations is comprised of subjecting the lead or termination to a molten hot solder dip process.

14. The method of manufacturing metal leads of claim 3 wherein the step of applying a coating to the metal leads is comprised of coating each metal lead with a coating that is chosen from the group consisting essentially of silver, gold, nickel, or tin.

15. The method of manufacturing a lead of claim 13 wherein the step of applying a coating to the metal leads of the integrated circuit is comprised of coating the lead with a coating of gold of about 2 micro-inches or less.

16. A method of manufacturing metal leads of an integrated circuit package comprising the steps of:
applying a coating to the metal leads of the integrated circuit package;
after coating the metal leads, flattening each of the metal leads by compression until each of the metal leads is substantially smoother and substantially less porous; and
wherein the coating has a thickness of about 10 microinches to about 1000 microinches prior to flattening; and
wherein the flattening occurs until there is a reduction of about 80% to 90% in porosity of the coating thickness after flattening as compared to before the flattening of the leads.

17. The method of manufacturing a lead of claim 16 wherein the step of applying a coating to the metal leads of the integrated circuit is comprised of subjecting the leads to a molten hot solder dip process.

18. The method of manufacturing a lead of claim 16 wherein the step of applying a coating to the metal leads of the integrated circuit is comprised of coating the lead with a coating of gold of about 2 micro-inches or less.

19. The method of manufacturing a lead of claim 16 further comprising:
flattening the metal leads of the integrated circuit package by rolling.

20. The method of manufacturing metal leads of claim 16 further comprising:
flattening the metal leads of the integrated circuit package by stamping.

21. The method of manufacturing a lead of claim 16 further comprising:
flattening the metal leads of the integrated circuit package by peening.

22. The method of manufacturing a lead of claim 16 further comprising:
flattening the metal leads of the integrated circuit package by coining.

23. The method of manufacturing a lead of claim 16 further comprising:
flattening the metal leads of the integrated circuit package by forging.

24. The method of manufacturing a lead of claim 16 further comprising:
flattening the metal leads of the integrated circuit package by hammering.

25. The method of manufacturing a lead of claim 16 wherein the step of applying a coating to the metal leads of the integrated circuit package is comprised of coating the leads with a Tin/Lead composition.

26. The method of manufacturing a lead of claim 16 wherein the step of applying a coating to the metal leads of the integrated circuit is comprised of coating the leads with a 80/20 Tin/Lead composition.

27. The method of manufacturing metal leads of claim 16 wherein the step of applying a coating to the metal leads of the integrated circuit package is comprised of coating the leads with a coating that is chosen from the group consisting essentially of silver, gold, nickel, or tin.

* * * * *